US008741692B1

(12) United States Patent
Fu

(10) Patent No.: US 8,741,692 B1
(45) Date of Patent: Jun. 3, 2014

(54) MEMS WAFER-LEVEL PACKAGING

(75) Inventor: Yee-Chung Fu, Fremont, CA (US)

(73) Assignee: Advanced NuMicro Systems, Inc., San Jose, CA (US)

( * ) Notice: Subject to any disclaimer, the term of this patent is extended or adjusted under 35 U.S.C. 154(b) by 133 days.

(21) Appl. No.: 13/233,979

(22) Filed: Sep. 15, 2011

Related U.S. Application Data

(60) Provisional application No. 61/383,653, filed on Sep. 16, 2010.

(51) Int. Cl.
*H01L 21/00* (2006.01)

(52) U.S. Cl.
USPC ........... 438/113; 438/116; 438/118; 438/455; 438/460; 457/417; 457/418

(58) Field of Classification Search
CPC ........... H01L 2924/01979; H01L 2924/01029; H01L 2924/14; H01L 2924/01078; H01L 2924/010143; H01L 21/14; H01L 21/79254; H01L 21/76251
USPC .......... 438/113, 116, 118, 455, 460; 257/417, 257/418
See application file for complete search history.

(56) References Cited

U.S. PATENT DOCUMENTS

| | | | | |
|---|---|---|---|---|
| 6,930,367 | B2 * | 8/2005 | Lutz et al. | 257/417 |
| 2005/0095833 | A1 * | 5/2005 | Lutz et al. | 438/597 |

* cited by examiner

*Primary Examiner* — Thinh T Nguyen
(74) *Attorney, Agent, or Firm* — Patent Law Group LLP; David C. Hsia

(57) ABSTRACT

A method for forming semiconductor devices with wafer-level packaging (WLP) includes providing a silicon-on-insulator (SOI) substrate, forming a mask on a silicon layer of the SOI substrate, etching the silicon layer through openings in the mask to form elements initially bonded to but later released from an insulator layer of the SOI substrate, bonding a support substrate to the silicon layer, depositing metal over through holes in the support substrate to contact the silicon layer, and singulating the semiconductor devices from the bonded SOI substrate and the support substrate. The support substrate defines depressions opposite the elements so the elements are not bonded to the support substrate. Each semiconductor device includes a hermetically sealed package having a portion of the SOI substrate and a portion of the support substrate.

11 Claims, 6 Drawing Sheets

MEMS WAFER-LEVEL PACKAGING

CROSS REFERENCE TO RELATED APPLICATIONS

This application claims the benefit of U.S. Provisional Application No. 61/383,653, filed Sep. 16, 2010, which is incorporated herein by reference.

FIELD OF INVENTION

This invention relates to a process for fabricating semiconductor devices, in particular micro-electromechanical systems (MEMS) devices, with wafer-level packaging (WLP).

DESCRIPTION OF RELATED ART

Wafer-level packaging (WLP) refers to packaging an integrated circuit at wafer level. Wafer-level packaging has the ability to enable integration of wafer fabrication, packaging, test, and burn-in at wafer level in order to streamline the manufacturing process undergone by a device from silicon start to customer shipment.

BRIEF DESCRIPTION OF THE DRAWINGS

In the drawings.

Use of the same reference numbers in different figures indicates similar or identical elements.

DETAILED DESCRIPTION OF THE INVENTION

In accordance with embodiments of the present disclosure, a method for fabricating micro-electromechanical systems (MEMS) devices utilizes a silicon-on-insulator (SOI) substrate and at least one or more silicon or glass substrates. After a series of etching, deposition, and anodic bonding, the semiconductor devices are produced with hermetically sealed wafer-level packages. The devices may be MEMS resonators, scanning mirrors, or switches.

Figure 1:
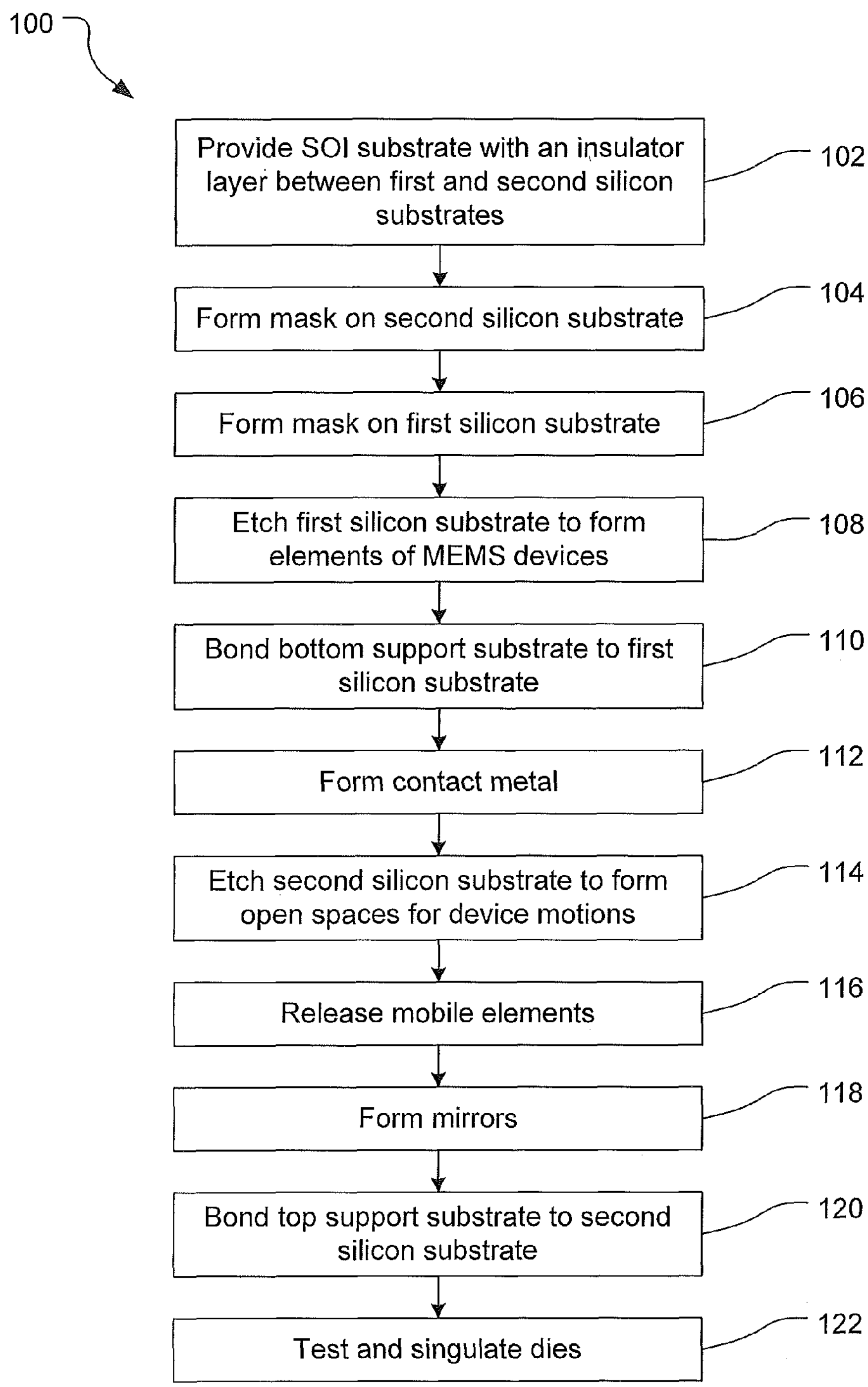
FIG. 1 shows an exemplary flowchart for a method to fabricate micro-electromechanical systems (MEMS) devices with wafer-level packaging (WLP)

FIG. 1 shows an exemplary flowchart for a method 100 to fabricate MEMS devices with wafer-level packaging (WLP) in one or more embodiments of the present disclosure. Method 100 may comprise one or more operations, functions or actions as illustrated by one or more blocks. Although the blocks are illustrated in a sequential order to demonstrate method 100, these blocks may also be performed in parallel, and/or in a different order than those described herein. Also, the various blocks may be combined into fewer blocks, divided into additional blocks, and/or eliminated based upon the desired implementation.

In one or more embodiments, the devices are MEMS scanning mirrors. A MEMS scanning mirror includes comb structures for actuating a mirror on a resonant mass and/or sensing the position of the mirror. The comb structures may be stationary and mobile comb teeth. The comb structures may be made from the same silicon layer so the mobile comb teeth are in the same plane, or the comb structures may be made from different silicon layers so the comb teeth are vertically offset from each other.

Figures 2, 3, 4, 5, 6:
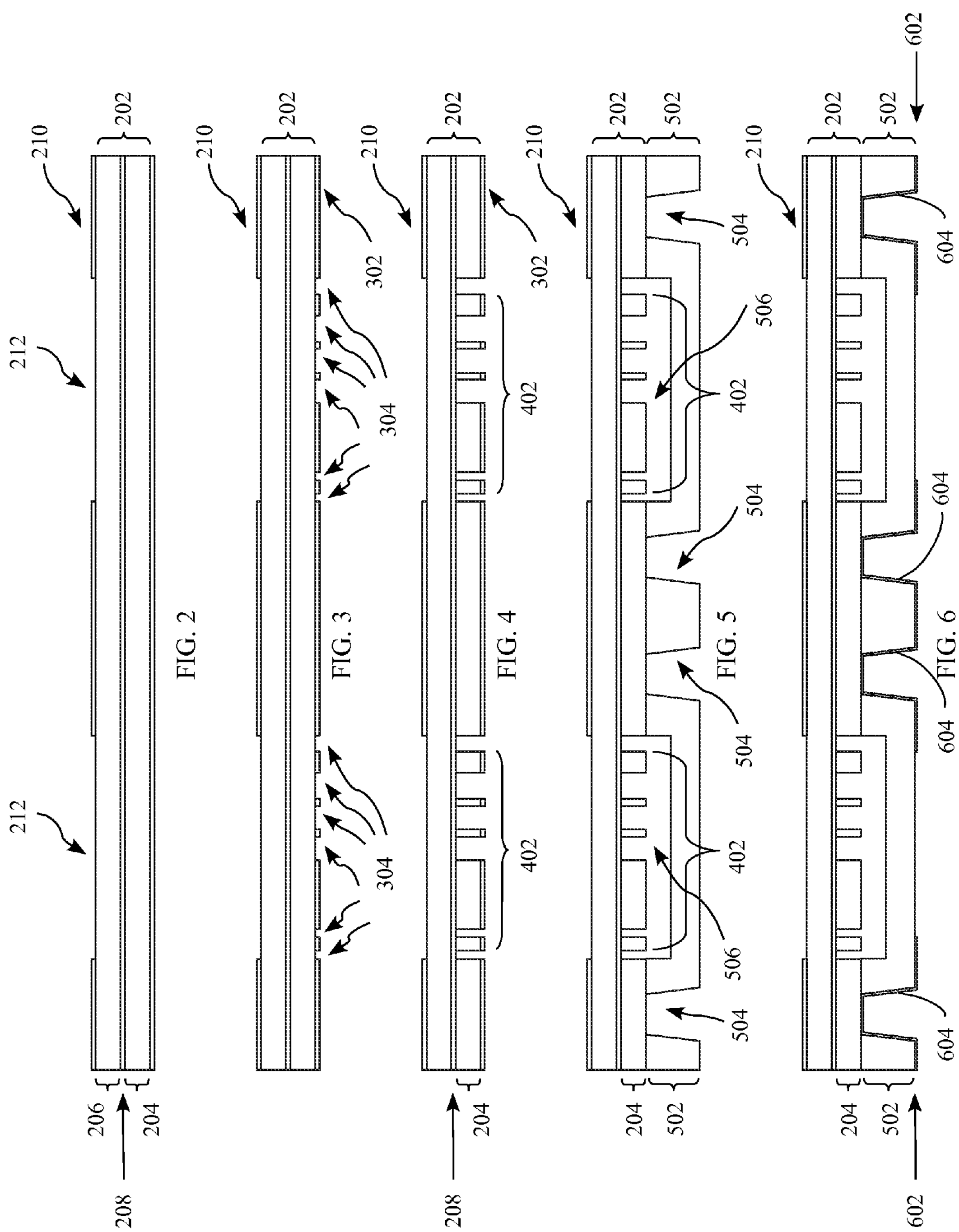
FIGS. 2 to 10 show exemplary cross-sectional views of the structures being formed through the method of FIG. 1.

Method 100 may begin in block 102. In block 102, as shown in FIG. 2, a SOI substrate 202 is provided. SOI substrate 202 includes a first silicon layer 204, a second silicon layer 206, and an insulator layer 208 (e.g., a buried oxide layer) between the first and the second silicon layers. Silicon layers 204 and 206 are doped to have low resistivity (e.g., 0.01 Ohm-cm). Block 102 may be followed by block 104.

In block 104, as shown in FIG. 2, a lithography mask 210 is formed on the surface of second silicon layer 206, which is the top surface of SOI wafer 202. Lithography mask 210 has openings 212 that expose predetermined areas of second silicon layer 206, which are later etched to define open spaces that accommodate vertical and/or horizontal motions of the MEMS devices. For MEMS devices that utilize vertical comb structures, lithography mask 210 may also define comb structures for actuation and/or sensing in second silicon layer 206. For MEM devices that utilize in-plane comb structures, second silicon layer 206 does not include any comb structures. Lithography mask 210 may be a photo resist, an oxide layer, or a combination of a photo resist and an oxide layer. Block 104 may be followed by block 106.

In block 106, as shown in FIG. 3, a lithography mask 302 is formed on the surface of first silicon layer 204, which is the bottom surface of SOI wafer 202. Lithography mask 302 has openings 304 that expose predetermined areas of first silicon layer 204, which are later etched to define the resonant masses and the comb structures. The resonant masses and the mobile comb teeth may move vertically or horizontally, such as translate parallel to the plane of first silicon layer 204, rotate about an axis perpendicular to the plane of the first silicon layer, translate along an axis perpendicular to the plane of the first silicon layer, or rotate about an axis in the plane of the first silicon layer. Lithography mask 302 may be a photo resist, an oxide layer, or a combination of a photo resist and an oxide layer. Block 106 may be followed by block 108.

In block 108, as shown in FIG. 4, first silicon layer 204 is etched to insulator layer 208 to form the resonant masses and the comb structures. The resonant masses and the comb structure are generally indicated as elements 402. First silicon layer 204 may be etched through lithography mask 302 using deep reactive-ion etching (DRIE). First silicon layer 204 is cleaned to remove lithography mask 302 after the etching. Block 108 may be followed by block 110.

In block 110, as shown in FIG. 5, a bottom support substrate 502 is bonded to first silicon layer 204. Bottom support substrate 502 may be a glass or a silicon substrate that is anodically bonded to first silicon layer 204. Bottom support substrate 502 is machined ahead of time to form through holes 504, which provide access to first silicon layer 204 (the device layer). The mating surface of bottom support substrate 502 is also machined ahead of time to form depressions 506 opposite elements 402. Depressions 506 are provided so elements 402 are not bonded to bottom support substrate 502. Depressions 504 may also accommodate vertical and/or horizontal motions of elements 402. Block 110 may be followed by block 112.

In block 112, as shown in FIG. 6, a metal 602 is deposited over through holes 504 down to exposed portions of first silicon layer 204 to form metal contacts/surface mount pads 604. Metal contacts/surface mount pads 604 are used to connect the MEMS devices to external circuitry for actuation and/or sensing. Block 112 may be followed by block 114.

Figures 7, 8, 9, 10:
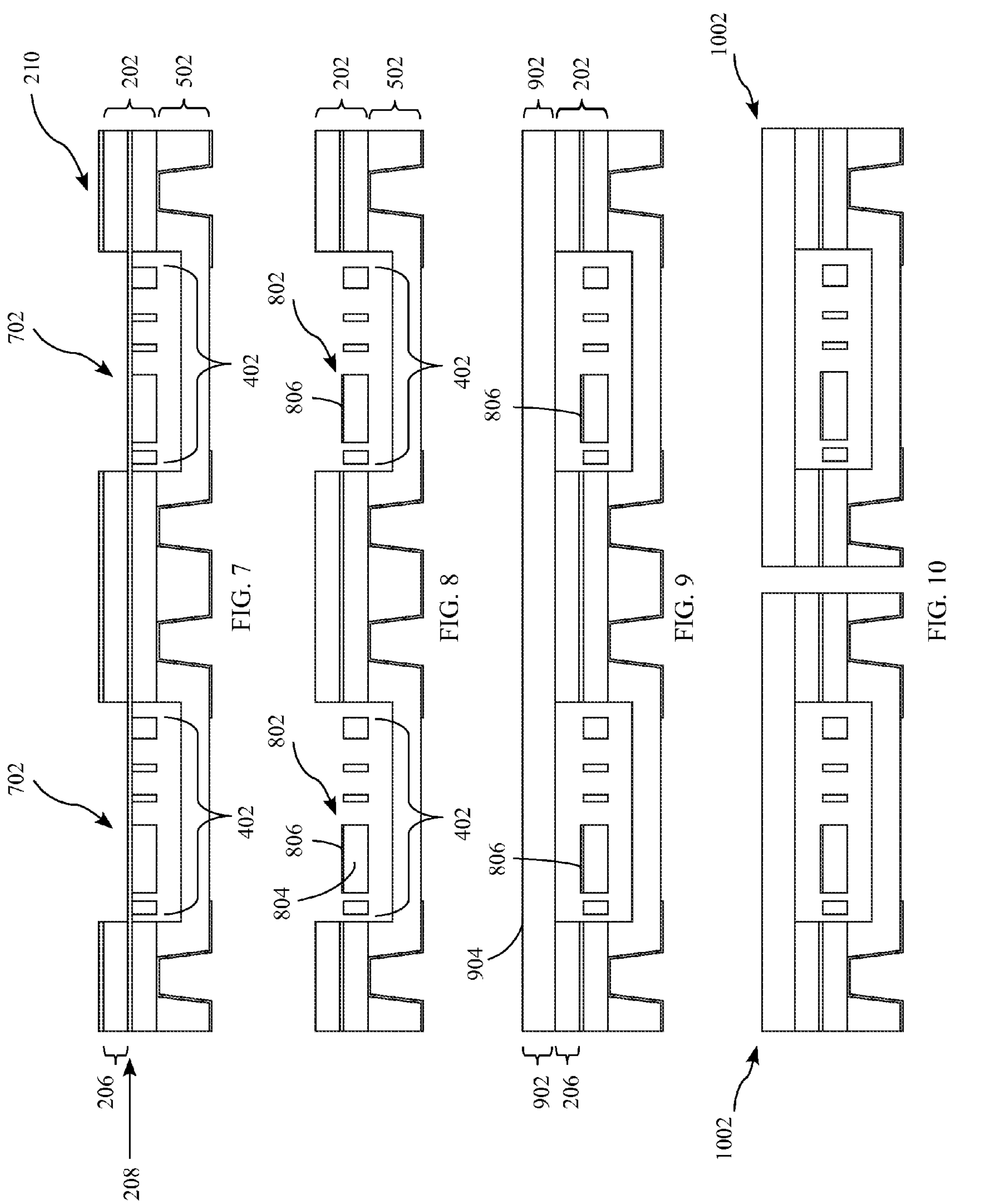

In block 114, as shown in FIG. 7, second silicon layer 206 is etched to insulator layer 208 to form opens spaces 702 that accommodate the vertical and/or the horizontal motions of elements 402. Second silicon layer 206 may be etched through lithography mask 210 using DRIE. Second silicon layer 206 is cleaned to remove lithography mask 210 after the etching. Block 114 may be followed by block 116.

In block 116, as shown in FIG. 8, elements 402 are released by removing portions of insulator layer 208 bonded to the elements. Block 116 may be followed by block 118.

In block 118, as shown in FIG. 8, a metal 802 is deposited on resonant masses 804 to form mirrors 806. Note that portions of insulator layer 208 on resonant masses 804 are removed in block 116 prior to forming mirrors 806. A coat mask may be used to perform the metal coating. Block 118 may be followed by block 120.

In block 120, as shown in FIG. 9, a top support substrate 902 is bonded to second silicon layer 206 to provide hermetically sealed spaces for device motions. The bonding may be performed under vacuum condition to produce vacuum sealed spaces for device motions. Top support substrate 902 may be a glass or a silicon substrate that is anodically bonded to second silicon layer 206. In case of an optical device, a glass substrate 902 with antireflection coating 904 is used to provide optical windows above mirrors 806. Block 120 may be followed by block 122.

In block 122, as shown in FIG. 10, the MEMS devices are tested and then diced into individual dies 1002 in hermetically or vacuumed sealed packages. A singulated die 1002 is a complete device that does not need any further package and may be placed on a printed circuit board using a ball grid array.

Figure 11:
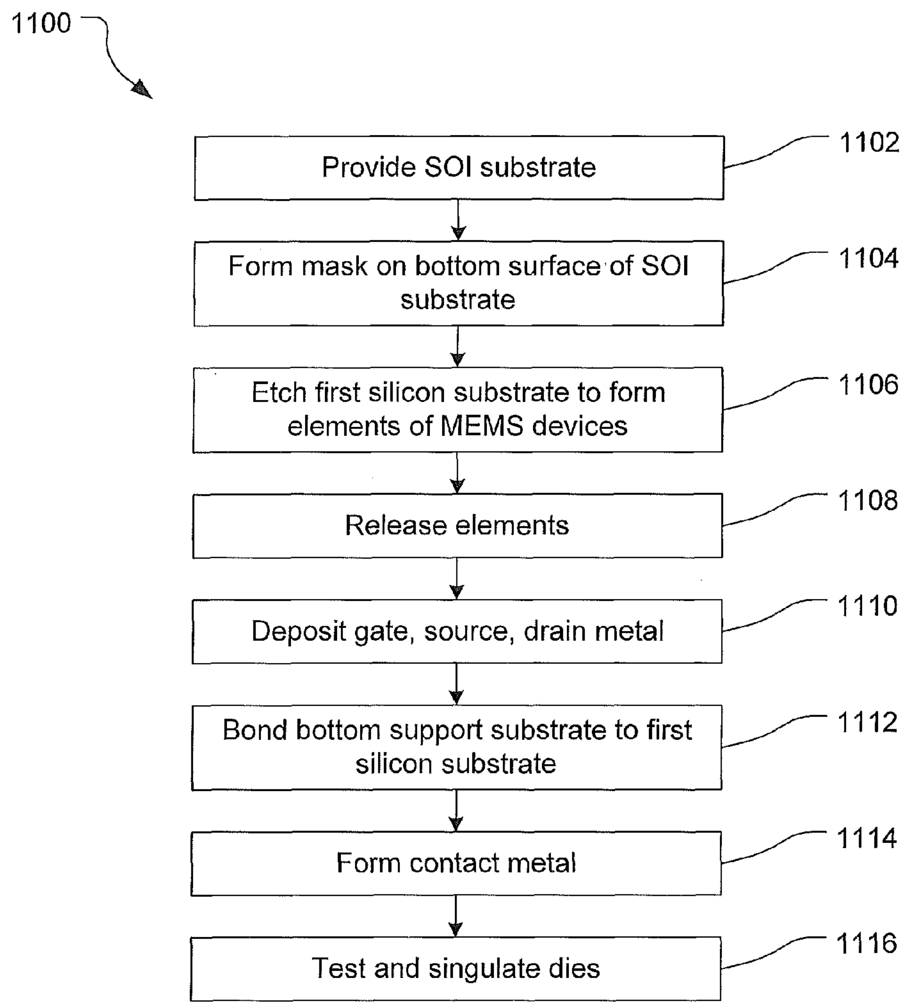
FIG. 11 shows an exemplary flowchart for another method to fabricate MEMS devices with WLP.

FIG. 11 shows an exemplary flowchart for a method 1100 to fabricate MEMS devices with WLP in one or more embodiments of the present disclosure. Method 1100 may comprise one or more operations, functions or actions as illustrated by one or more blocks. Although the blocks are illustrated in a sequential order to demonstrate method 1100, these blocks may also be performed in parallel, and/or in a different order than those described herein. Also, the various blocks may be combined into fewer blocks, divided into additional blocks, and/or eliminated based upon the desired implementation.

In one or more other embodiments, the devices are MEMS switches. A MEMS switch includes a comb structure for actuating a gate conductor to connect source and drain conductors. The comb structures may be stationary and mobile comb teeth. The comb structures may be made from the same silicon layer so the mobile comb teeth are in the same plane.

Figures 12, 13, 14, 15:
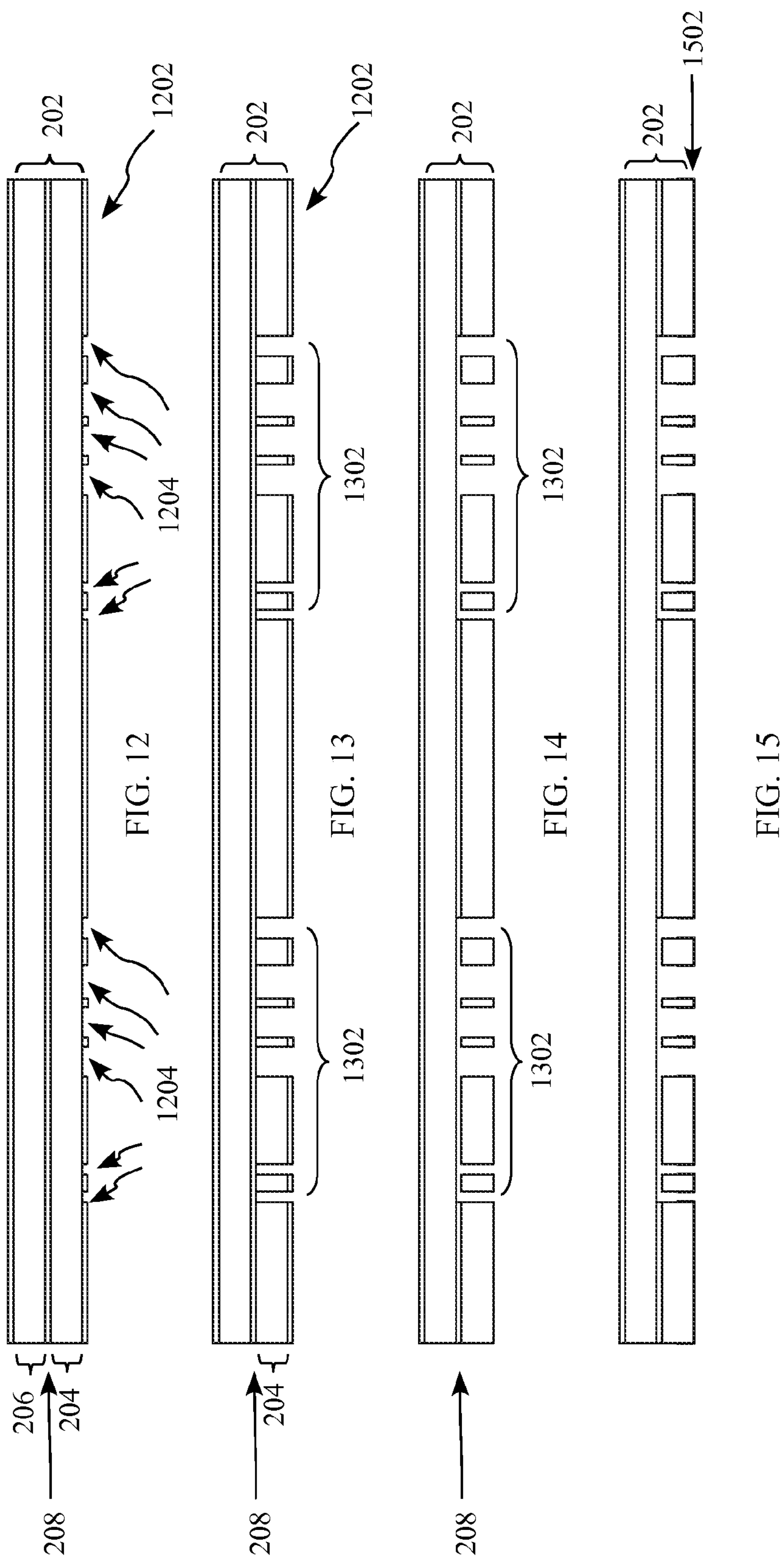
FIGS. 12 to 18 show exemplary cross-sectional views of the structures being formed through the method of FIG. 11, all arranged in accordance with embodiments of the present disclosure.

Method 1100 may begin in block 1102. In block 102, as shown in FIG. 12, SOI substrate 202 is provided. Block 1102 may be followed by block 1104.

In block 1104, as shown in FIG. 12, a lithography mask 1202 is formed on the surface of first silicon layer 204, which is the bottom surface of SOI wafer 202. Lithography mask 1202 has openings 1204 that expose predetermined areas of first silicon layer 204, which are later etched to define gates, source terminals, drain terminals, and comb structures for actuation and/or sensing. The gate and the mobile comb teeth may move horizontally, such as rotate about an axis perpendicular to the plane of first silicon layer 204 or translate parallel to the plane of first silicon layer 204. Lithography mask 1202 may be a photo resist, an oxide layer, or a combination of a photo resist and an oxide layer. Block 1104 may be followed by block 1106.

In block 1106, as shown in FIG. 13, first silicon layer 204 is etched to insulator layer 208 to form the gates, the sources, the drains, and the comb structures. The gates and the mobile comb teeth are generally indicated as elements 1302. First silicon layer 204 may be etched through lithography mask 1202 using DRIE. Lithography mask 1202 may be removed after the etching. Block 1106 may be followed by block 1108.

In block 1108, as shown in FIG. 14, elements 1302 are released by removing portions of insulator layer 208 bonded to elements. Block 1108 may be followed by block 1110.

In block 1110, as shown in FIG. 15, a metal 1502 is deposited over the gates, the sources, and the drains. Metal 1502 collects on both the horizontal and the lateral surfaces of the gates, the sources, and the drains to form gate conductors, source conductors, and drain conductors, respectively. When actuated, a gate moves towards a source and a drain so the lateral surface of the gate conductor contacts the lateral surfaces of the source conductor and the drain conductor to complete a circuit. Block 1110 may be followed by block 1112.

Figure 16:
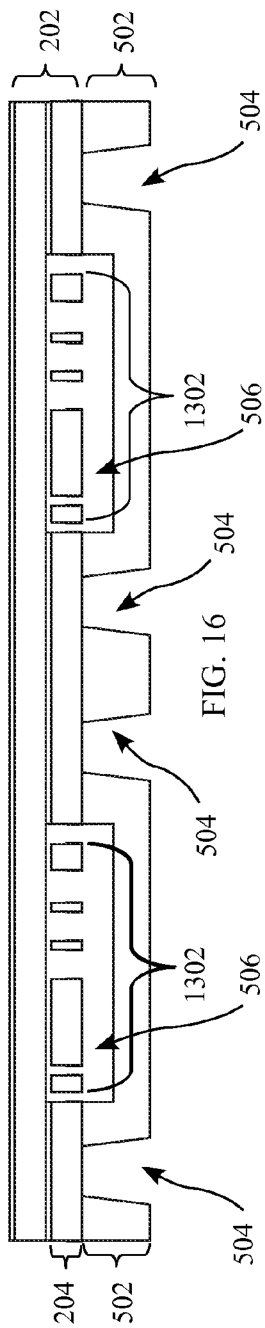

In block 1112, as shown in FIG. 16, bottom support substrate 502 is bonded to first silicon layer 204. Bottom support substrate 502 may be a glass or a silicon substrate that is anodically bonded to first silicon layer 204. The bonding may be performed under vacuum condition to produce vacuum sealed spaces for device motions. Bottom support substrate 502 has through holes 504 for accessing first silicon layer 204 and depressions 506 for accommodating elements 1302. Block 1112 may be followed by block 1114.

Figure 17:
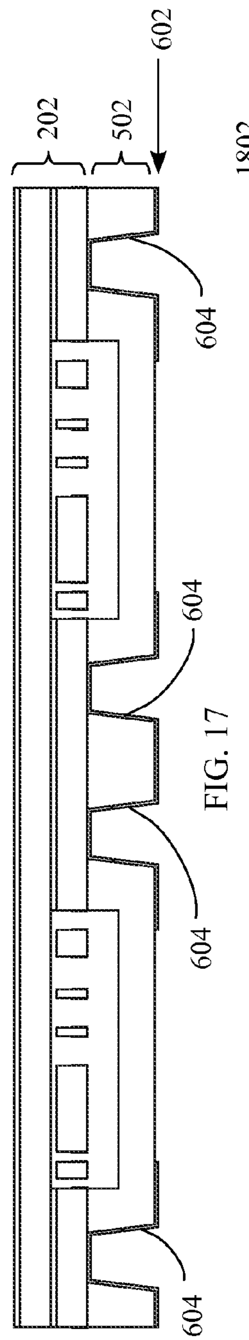

In block 1114, as shown in FIG. 17, metal 602 is deposited over through holes 504 down to first silicon layer 204 to form metal contacts/surface mount pads 604. Block 1114 may be followed by block 1116.

Figure 18:
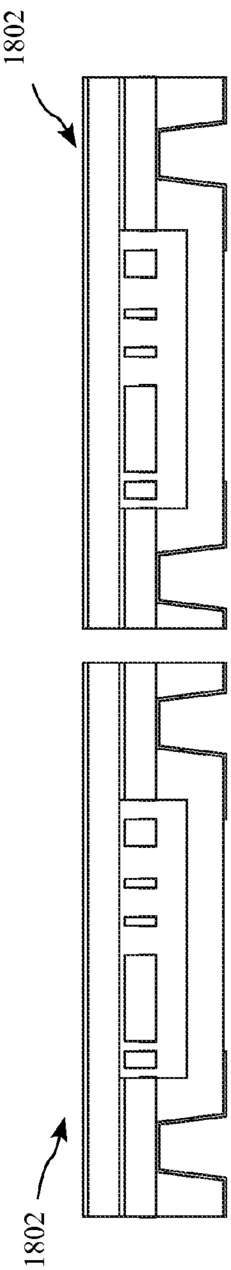

In block 1126, as shown in FIG. 18, the MEMS devices are tested and then diced into individual dies 1802 in hermetically or vacuumed sealed packages. A singulated die 1802 is a complete device that does not need any further package and may be placed on a printed circuit board using a ball grid array.

Various other adaptations and combinations of features of the embodiments disclosed are within the scope of the invention.

The invention claimed is:

1. A method for forming semiconductor devices with wafer-level packaging (WLP), comprising:

providing a silicon-on-insulator (SOI) substrate, the SOI substrate comprising a first silicon layer, a second silicon layer, and an insulator layer between the first and the second silicon layers;

forming a mask on the first silicon layer, the mask defining openings;

etching the first silicon layer through the openings to the insulator layer to form elements initially bonded to but later released from the insulator layer;

bonding a support substrate to the first silicon layer, the support substrate defining through holes, the support substrate defining depressions opposite the elements so the elements are not bonded to the support substrate;

depositing a metal over the through holes to contact the first silicon layer; and singulating devices from the bonded SOI substrate and the support substrate, wherein each device comprises a hermetically sealed package including a portion of the SOI substrate and a portion of the support substrate.

2. The method of claim 1, further comprising:

forming an other mask on the second silicon layer, the other mask defining other openings;

etching the second silicon layer through the other openings to the insulator layer to create open spaces in the second silicon layer opposite the elements;

bonding an other support substrate to the second silicon layer;

wherein singulating the devices comprises singulating the devices from the bonded SOI substrate, the support substrate, and the other support substrate, and the hermetically sealed package further includes a portion of the other support substrate.

3. The method of claim 2, further comprising:

after etching the second silicon layer and prior to bonding the other support substrate to the second silicon layer, removing portions of the insulator layer to release the elements.

4. The method of claim 3, further comprising:

after removing the portions of the insulator layer to release the elements and prior to bonding the other support substrate to the second silicon layer, depositing an other metal over portions of the elements to form mirrors.

5. The method of claim 4, wherein the depressions in the support substrate and the open spaces in the second silicon layer accommodate vertical motions of the minors.

6. The method of claim 5, wherein the support substrate and the other support substrate are glass or silicon substrates.

7. The method of claim 1, further comprising:

after etching the first silicon layer and prior to bonding the support substrate to the first silicon layer, depositing an other metal over the elements where the other metal collects on horizontal and lateral surfaces of the elements.

8. The method of claim 7, further comprising:

after etching the first silicon layer and prior to depositing the other metal, removing portions of the insulator layer to release the elements.

9. The method of claim 8, wherein the depressions in the support substrate and the removed portions of the insulator layer accommodate horizontal motions of the devices.

10. The method of claim 9, wherein the support substrate is a glass or silicon substrate.

11. The method of claim 1, wherein bonding the support substrate to the first silicon layer occurs under vacuum so the hermetically sealed package is vacuum sealed.

* * * * *